(12) United States Patent
Abdelhalem et al.

(10) Patent No.: US 8,975,968 B2
(45) Date of Patent: Mar. 10, 2015

(54) AMPLIFIERS WITH IMPROVED ISOLATION

(71) Applicant: QUALCOMM Incorporated, San Diego, CA (US)

(72) Inventors: Sherif Abdelhalem, San Diego, CA (US); William James Biederman, III, Fox Island, WA (US)

(73) Assignee: QUALCOMM Incorporated, San Diego, CA (US)

( * ) Notice: Subject to any disclaimer, the term of this patent is extended or adjusted under 35 U.S.C. 154(b) by 72 days.

(21) Appl. No.: 13/750,878

(22) Filed: Jan. 25, 2013

(65) Prior Publication Data

US 2014/0210554 A1 Jul. 31, 2014

(51) Int. Cl.
| | | |
|---|---|---|
| H03F 1/02 | (2006.01) | |
| H03F 3/193 | (2006.01) | |
| H03F 1/22 | (2006.01) | |
| H03F 1/52 | (2006.01) | |
| H03F 3/22 | (2006.01) | |

(52) U.S. Cl.
CPC .............. *H03F 1/0205* (2013.01); *H03F 3/193* (2013.01); *H03F 1/22* (2013.01); *H03F 1/523* (2013.01); *H03F 3/22* (2013.01); *H03F 2200/294* (2013.01); *H03F 2200/426* (2013.01)
USPC ....................................................... 330/311

(58) Field of Classification Search
CPC ... H03F 3/245; H03F 2200/451; H03F 3/195; H03F 1/0277; H03F 3/72; H03F 2200/534; H03F 2200/537; H03F 2200/541; H03F 3/19; H03F 2200/294; H03F 1/223; H03F 3/45179; H03F 3/193; H03F 1/22
USPC .......................................... 330/277, 283, 311
See application file for complete search history.

(56) References Cited

U.S. PATENT DOCUMENTS

| 7,352,241 | B2 * | 4/2008 | Lee ................................ 330/254 |
|---|---|---|---|
| 7,443,241 | B2 | 10/2008 | Fong et al. |
| 7,463,093 | B2 | 12/2008 | Taylor et al. |
| 7,482,879 | B2 | 1/2009 | Koutani et al. |

(Continued)

FOREIGN PATENT DOCUMENTS

| JP | 2003324343 A | 11/2003 |
|---|---|---|
| WO | 2011019850 A1 | 2/2011 |

OTHER PUBLICATIONS

International Search Report and Written Opinion for International Application No. PCT/US2014/012524, ISA/EPO, Date of Mailing Jul. 28, 2014, 13 pages.

*Primary Examiner* — Khanh V Nguyen
(74) *Attorney, Agent, or Firm* — Toler Law Group, P.C.

(57) ABSTRACT

Amplifiers with improved isolation are disclosed. In an exemplary design, an apparatus (e.g., a wireless device, an integrated circuit, etc.) includes an amplifier having a gain transistor, first and second cascode transistors, and a shunt transistor. The gain transistor receives an input signal and provides an amplified signal. The first cascode transistor is coupled between the gain transistor and an intermediate node and receives the amplified signal. The second cascode transistor is coupled between the intermediate node and an output node and provides an output signal. The shunt transistor is coupled between the intermediate node and circuit ground. The first and second cascode transistors are enabled to provide the output signal. The shunt transistor is (i) disabled when the cascode transistors are enabled and (ii) enabled to short the intermediate node to circuit ground when the cascode transistors are disabled.

20 Claims, 12 Drawing Sheets

(56) References Cited

U.S. PATENT DOCUMENTS

| | | | |
|---|---|---|---|
| 7,541,875 B2* | 6/2009 | Taylor et al. | 330/311 |
| 7,570,119 B2* | 8/2009 | Hamaguchi | 330/311 |
| 7,649,418 B2* | 1/2010 | Matsui | 330/284 |
| 8,022,772 B2* | 9/2011 | Cassia et al. | 330/311 |
| 8,310,314 B2* | 11/2012 | Lee | 330/311 |
| 8,624,678 B2* | 1/2014 | Scott et al. | 330/311 |
| 8,686,796 B2* | 4/2014 | Presti | 330/311 |
| 2006/0119435 A1 | 6/2006 | Oh et al. | |
| 2009/0036065 A1 | 2/2009 | Siu | |
| 2010/0188154 A1 | 7/2010 | Yeung et al. | |
| 2012/0105157 A1 | 5/2012 | Ahn et al. | |

* cited by examiner

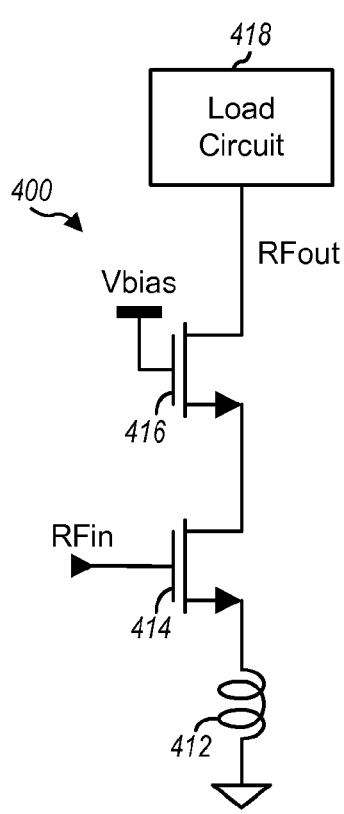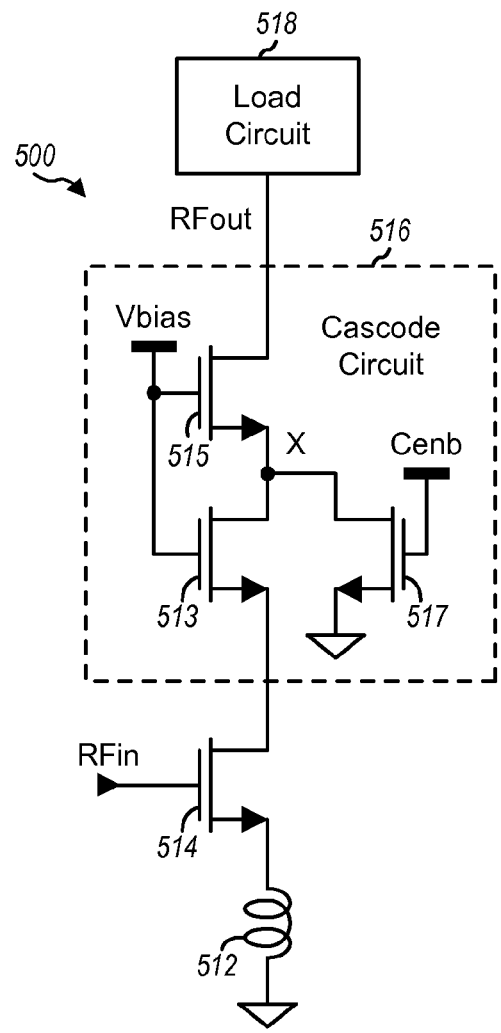
FIG. 4
FIG. 5

AMPLIFIERS WITH IMPROVED ISOLATION

BACKGROUND

I. Field

The present disclosure relates generally to electronics, and more specifically to amplifiers.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated signal, amplify the modulated signal to obtain an output RF signal having the proper transmit power level, and transmit the output RF signal via an antenna to a base station. For data reception, the receiver may obtain a received RF signal via the antenna and may amplify and process the received RF signal to recover data sent by the base station.

A wireless device may include amplifiers of different types for different purposes. For example, a wireless device may include a low noise amplifier (LNA) in a receiver, a driver amplifier (DA) and a power amplifier (PA) in a transmitter, and a variable gain amplifier (VGA) in the receiver and/or transmitter. The wireless device may include multiple amplifiers having outputs coupled together, with each amplifier being either enabled to provide an output signal or disabled to provide no output signal. It may be desirable to provide good isolation when an amplifier is disabled in order to mitigate performance degradation due to a leaked signal.

BRIEF DESCRIPTION OF THE DRAWINGS

FIG. 4 shows an exemplary design of an LNA.

FIG. 5 shows an exemplary design of an LNA with improved isolation.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Amplifiers with improved isolation are disclosed herein. These amplifiers may be used for various electronic devices such as wireless communication devices (e.g., cellular phones, smartphones, etc.), tablets, personal digital assistants (PDAs), handheld devices, wireless modems, laptop computers, smartbooks, netbooks, cordless phones, wireless local loop (WLL) stations, Bluetooth devices, consumer electronic devices, etc. For clarity, the use of amplifiers with improved isolation in a wireless communication device is described below.

Figure 1:
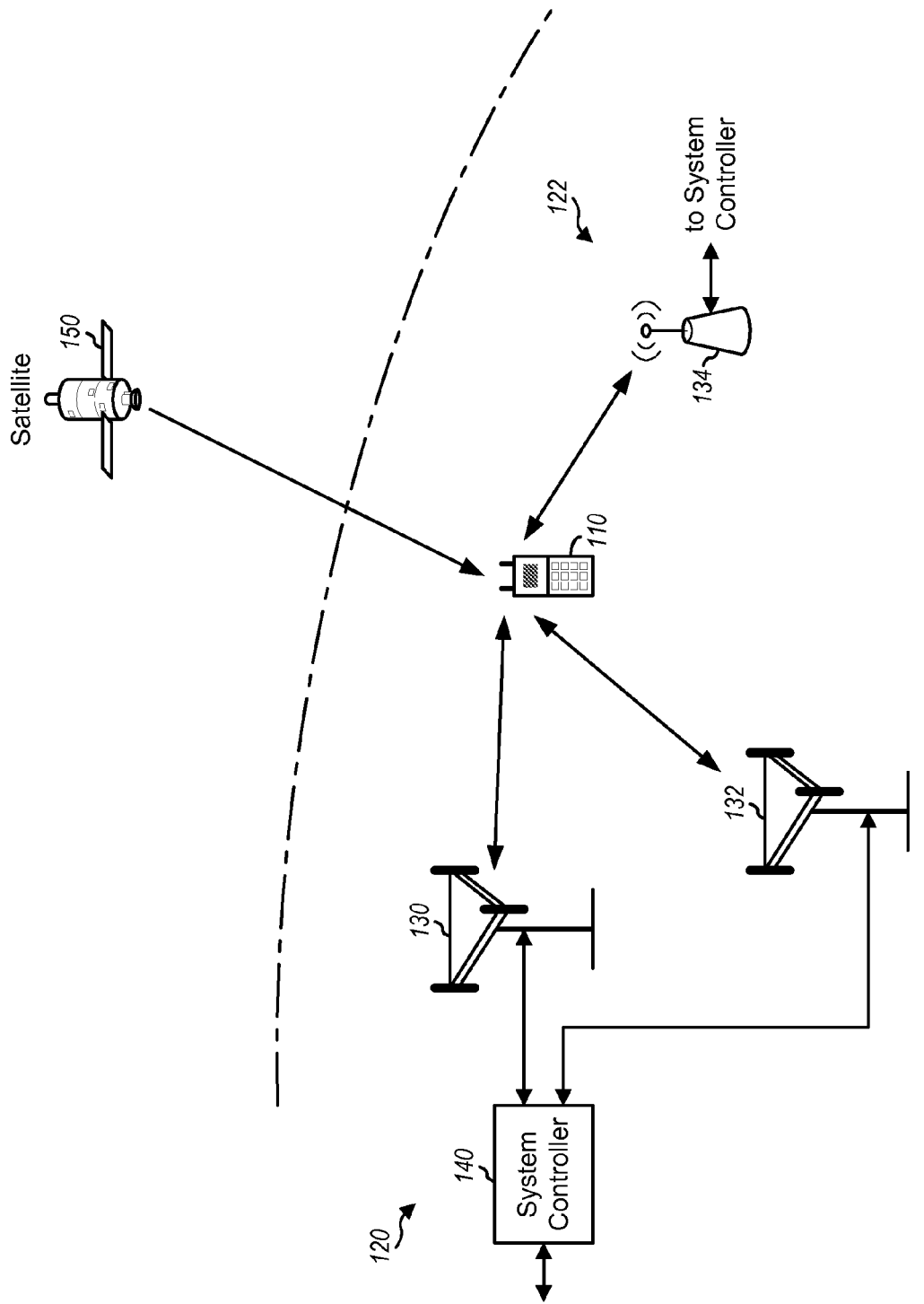
FIG. 1 shows a wireless device communicating with a wireless system.

FIG. 1 shows a wireless device 110 communicating with a wireless communication system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Time Division Synchronous CDMA (TD-SCDMA), or some other version of CDMA. For simplicity, FIG. 1 shows wireless system 120 including three base stations 130, 132 and 134 and one system controller 140. In general, a wireless system may include any number of base stations and any set of network entities. A base station may also be referred to as a Node B, an evolved Node B (eNB), an access point, etc.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations, signals from satellites (e.g., a satellite 150) in one or more global navigation satellite systems (GNSS), etc. Wireless device 110 may support one or more radio technologies for wireless communication such as LTE, WCDMA, CDMA 1X, TD-SCDMA, GSM, 802.11, etc.

Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz. LTE Release 11 supports 35 bands, which are referred to as LTE/UMTS bands and are listed in a publicly available document 3GPP TS 36.101. In general, any number of band groups may be defined. Each band group may cover any range of frequencies, which may or may not match any of the frequency ranges given above. Each band group may include any number of bands.

Wireless device 110 may support carrier aggregation, which is operation on multiple carriers. Carrier aggregation may also be referred to as multi-carrier operation. A carrier may refer to a range of frequencies used for communication and may be associated with certain characteristics. For example, a carrier may be associated with system information and/or control information describing operation on the carrier. A carrier may also be referred to as a component carrier (CC), a frequency channel, a cell, etc. A band may include one or more carriers. Each carrier may cover up to 20 MHz in LTE. Wireless device 110 may be configured with up to 5 carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
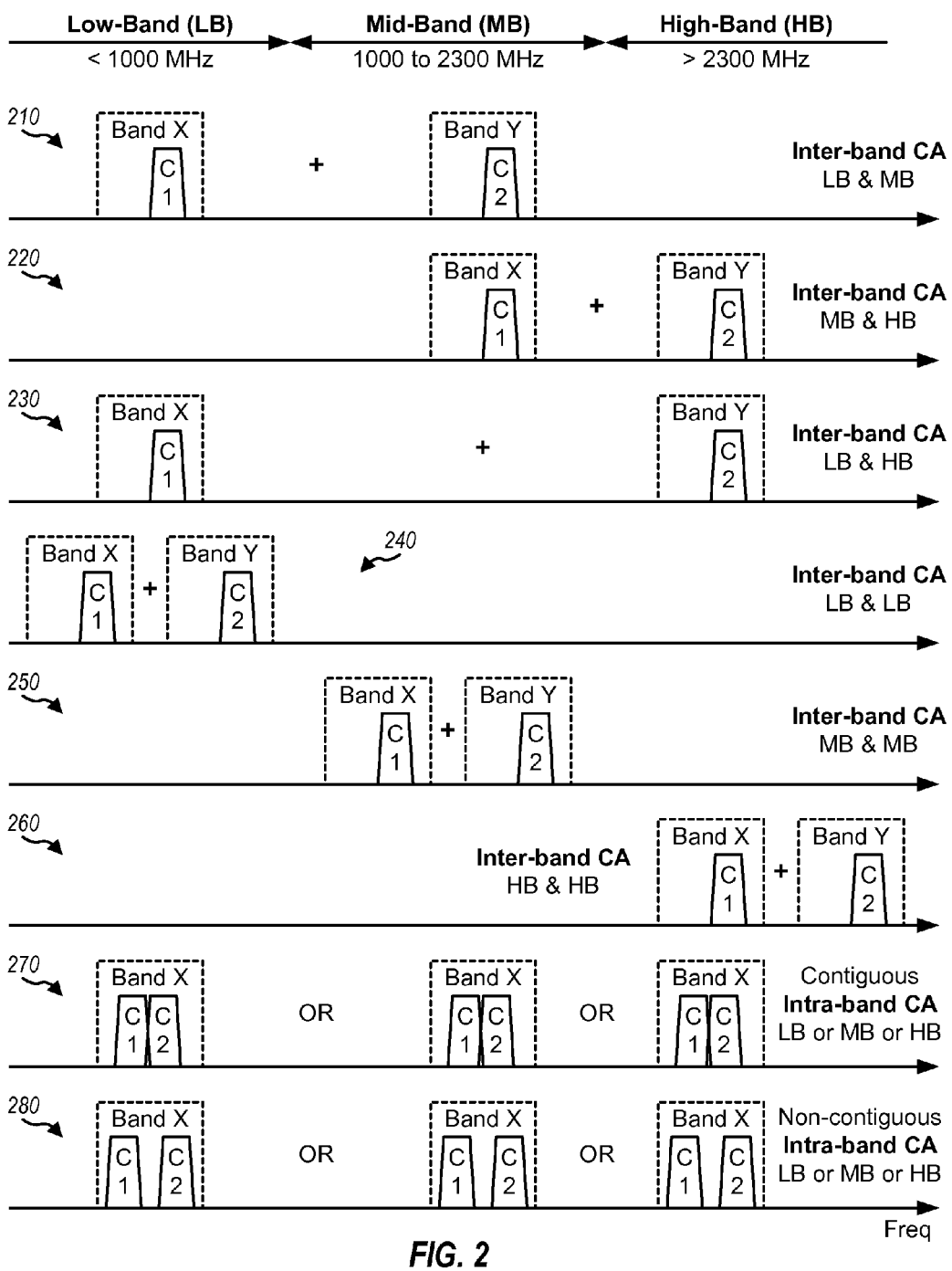
FIG. 2 shows various examples of carrier aggregation (CA).

FIG. 2 shows various CA scenarios that may be supported by wireless device 110. For simplicity, FIG. 2 shows wireless device 110 being configured with only one carrier in a band for inter-band CA. In general, wireless device 110 may be configured with one or more carriers in a given band.

Scenario 210 covers inter-band CA with one carrier C1 in band X in low-band and one carrier C2 in band Y in mid-band being configured for wireless device 110. Scenario 220 covers inter-band CA with one carrier C1 in band X in mid-band and one carrier C2 in band Y in high-band being configured for wireless device 110. Scenario 230 covers inter-band CA with one carrier C1 in band X in low-band and one carrier C2 in band Y in high-band being configured for wireless device 110.

Scenario 240 covers inter-band CA with one carrier C1 in band X in low-band and one carrier C2 in band Y also in low-band being configured for wireless device 110. Scenario 250 covers inter-band CA with one carrier C1 in band X in mid-band and one carrier C2 in band Y also in mid-band being configured for wireless device 110. Scenario 260 covers inter-band CA with one carrier C1 in band X in high-band and one carrier C2 in band Y also in high-band being configured for wireless device 110.

Scenario 270 covers contiguous intra-band CA with two adjacent carriers C1 and C2 in band X in low-band, or mid-band, or high-band being configured for wireless device 110. Scenario 280 covers non-contiguous intra-band CA with two non-adjacent carriers C1 and C2 in band X in low-band, or mid-band, or high-band being configured for wireless device 110.

FIG. 2 shows some examples of carrier aggregation. Carrier aggregation may also be supported for other combinations of bands and band groups.

Wireless device 110 may concurrently receive multiple transmitted signals at different frequencies. These multiple transmitted signals may be sent by one or more base stations on multiple carriers at different frequencies for carrier aggregation. These multiple transmitted signals may also be sent by different base stations for coordinated multi-point (CoMP) transmission, handover, etc. These multiple transmitted signals may also be sent by different wireless systems for concurrent voice/data, or data/data, or voice/voice, etc.

Figure 3:
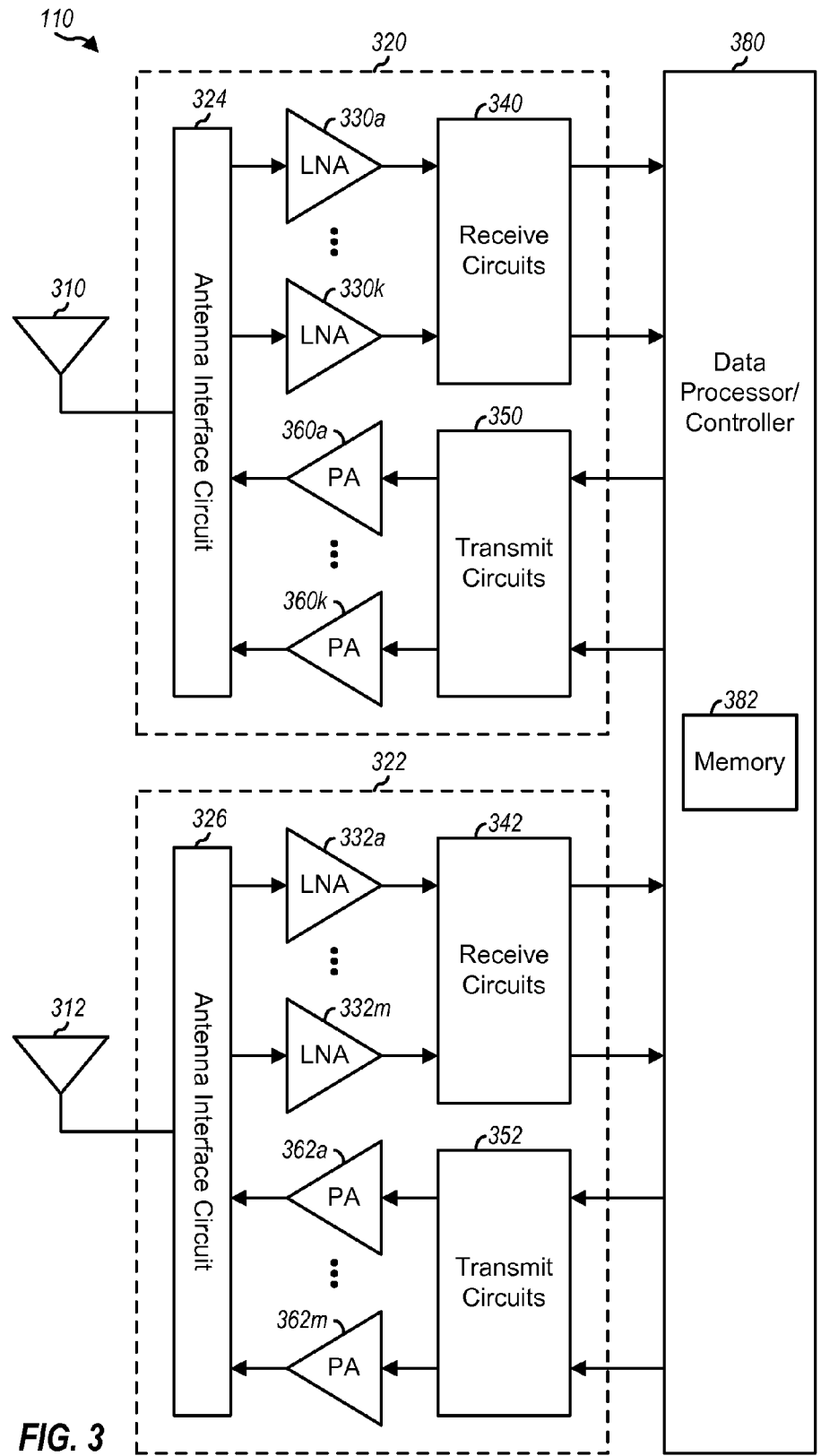
FIG. 3 shows a block diagram of the wireless device in FIG. 1.

FIG. 3 shows a block diagram of an exemplary design of wireless device 110 in FIG. 1. In this exemplary design, wireless device 110 includes a transceiver 320 coupled to a primary antenna 310, a transceiver 322 coupled to a secondary antenna 312, and a data processor/controller 380. Transceiver 320 includes an antenna interface circuit 324, multiple (K) LNAs 330a to 330k, receive circuits 340, transmit circuits 350, and K power amplifiers (PAs) 360a to 360k. Transceiver 322 includes an antenna interface circuit 326, multiple (M) LNAs 332a to 332m, receive circuits 342, transmit circuits 352, and M PAs 362a to 362m. Transceivers 320 and 322 may support multiple frequency bands, carrier aggregation, multiple radio technologies, multiple wireless systems, receive diversity, multiple-input multiple-output (MIMO) transmission from multiple transmit antennas to multiple receive antennas, etc.

For data reception, antenna 310 receives signals from base stations and/or other transmitter stations and provides a received RF signal, which is routed through antenna interface circuit 324 and provided as an input RF signal to a selected LNA 330. Antenna interface circuit 324 may include switches, duplexers, diplexers, transmit filters, receive filters, matching circuits, etc. The selected LNA 330 amplifies the input RF signal and provides one or more amplified RF signals to receive circuits 340. Receive circuits 340 downconvert each amplified RF signal from RF to baseband, filter and amplify the downconverted signal, and provide an input baseband signal to data processor 380. Receive circuits 340 may include mixers, filters, amplifiers, matching circuits, oscillators, local oscillator (LO) generators, phase locked loops (PLLs), etc.

For data transmission, data processor 380 processes (e.g., encodes and modulates) data to be transmitted and provides one or more output baseband signals to transmit circuits 350. Transmit circuits 350 amplify, filter, and upconvert each output baseband signal from baseband to RF and provide a modulated signal to a selected PA 360. Transmit circuits 350 may include amplifiers, filters, mixers, matching circuits, oscillators, LO generators, PLLs, etc. The selected PA 360 amplifies the modulated signal and provides an output RF signal having the proper transmit power level. The output RF signal is routed through antenna interface circuit 324 and transmitted via antenna 310.

LNAs 332, receive circuits 342, transmit circuits 352, and PAs 362 within transceiver 322 may operate in similar manner as LNAs 330, receive circuits 340, transmit circuits 350, and PAs 360 within transceiver 320. Transceivers 320 and 322 may also include other circuits not shown in FIG. 3. All or a portion of transceivers 320 and 322 may be implemented on one or more analog integrated circuits (ICs), RF ICs (RFICs), mixed-signal ICs, etc. For example, LNAs 330 and receive circuits 340 may be implemented on one module, which may be an RFIC, etc. The circuits in transceivers 320 and 322 may also be implemented in other manners.

Data processor/controller 380 may perform various functions for wireless device 110. For example, data processor 380 may perform processing for data being received via receiver circuits 340 and 342 and data being transmitted via transmit circuits 350 and 352. Controller 380 may control the operation of the various circuits within transceivers 320 and 322. A memory 382 may store program codes and data for data processor/controller 380. Data processor/controller 380 may be implemented on one or more application specific integrated circuits (ASICs) and/or other ICs.

LNAs 330 and 332 in FIG. 3 may be implemented in various manners. Some exemplary circuit designs of LNAs 330 and 332 are described below. LNAs 330 and 332 may also be implemented with transistors of various types. Some exemplary circuit designs of LNAs 330 and 332 with N-channel metal oxide semiconductor (NMOS) transistors are described below.

FIG. 4 shows a schematic diagram of an exemplary design of an LNA 400 with inductive degeneration and cascode shutoff. LNA 400 includes a source degeneration inductor 412, a gain transistor 414, and a cascode transistor 416. Gain transistor 414 has its gate receiving an input RF signal (RFin) and its source coupled to one end of inductor 412. The other end of inductor 412 is coupled to circuit ground. Cascode transistor 416 has its source coupled to the drain of gain transistor 414 and its drain coupled to a load circuit 418. Gain transistor 414 and cascode transistor 416 may be implemented with NMOS transistors (as shown in FIG. 4) or with transistors of other types.

Gain transistor 414 amplifies the input RF signal and provides an amplified signal. Cascode transistor 416 buffers the amplified signal and provides an output RF signal (RFout). Cascode transistor 416 is controlled by a bias voltage (Vbias) at its gate. Cascode transistor 416 may be (i) enabled or turned ON by setting the Vbias voltage to a suitable voltage or (ii) disabled or turned OFF by setting the Vbias voltage to a low voltage. Ideally, when cascode transistor 416 is disabled, an open circuit should exist between gain transistor 414 and the output of LNA 400. However, in a practical implementation, a leakage path exists through cascode transistor 416 when it is disabled. This leakage path may result in poor isolation between gain transistor 414 and other circuits (e.g., a downconverter) coupled to load circuit 418, which may be undesirable.

In an aspect of the present disclosure, an amplifier may include a cascode circuit that can provide improved isolation when the amplifier is disabled. A cascode circuit is a circuit that can either pass a signal between an input and an output of the cascode circuit or block the signal from passing through. A cascode circuit may include (i) a through path to pass a signal when an amplifier is enabled and (ii) a shunt path to circuit ground to provide better isolation when the amplifier is disabled. A cascode circuit may include (i) multiple cascode transistors coupled in series for a through path between the input and output of the cascode circuit and (ii) a shunt transistor coupled between an intermediate node and circuit ground for a shunt path. A cascode circuit may perform buffering in similar manner as a cascode transistor and may replace the cascode transistor.

FIG. 5 shows a schematic diagram of an exemplary design of an LNA 500 with improved isolation. LNA 500 may be used for any of LNAs 330 and 332 in FIG. 3. In the exemplary design shown in FIG. 5, LNA 500 includes a source degeneration inductor 512, a gain transistor 514, and a cascode circuit 516. Gain transistor 514 has its gate receiving an input RF signal, its source coupled to one end of inductor 512, and its drain coupled to cascode circuit 516. The other end of inductor 512 is coupled to circuit ground. Gain transistor 514 may also have its source coupled directly to circuit ground (instead of to a source degeneration inductor). Cascode circuit 516 is further coupled to a load circuit 518 and provides an output RF signal. Gain transistor 514 and cascode circuit 516 may be implemented with NMOS transistors (as shown in FIG. 5) or with transistors of other types.

In the exemplary design shown in FIG. 5, cascode circuit 516 includes (i) two cascode transistors 513 and 515 coupled in a stack and (ii) a shunt transistor 517 coupled between cascode transistors 513 and 515 and circuit ground. Cascode transistor 513 has its source coupled to the drain of gain transistor 514, its gate receiving a bias voltage (Vbias), and its drain coupled to node X. Cascode transistor 515 has its source coupled to node X, its gate coupled to the gate of transistor 513 and receiving the Vbias voltage, and its drain coupled to load circuit 518 and providing the output RF signal. Shunt transistor 517 has its source coupled to circuit ground, its gate receiving a control signal (Cenb), and its drain coupled to node X.

Cascode transistors 513 and 515 may be enabled or disabled in similar manner as cascode transistor 416 in FIG. 4. In particular, cascode transistors 513 and 515 may be enabled by applying an appropriate bias voltage to the gates of transistors 513 and 515. In this case, shunt transistor 517 may be disabled by applying a low voltage (or logic low) to the gate of transistor 517. Conversely, cascode transistors 513 and 515 may be disabled by applying a low bias voltage to the gates of transistors 513 and 515. In this case, transistor 517 may be enabled by applying a high voltage (or logic high) to the gate of transistor 517. Transistor 517 would pull node X to circuit ground, which would short any signal leakage to circuit ground. Shorting node X to circuit ground may improve isolation when cascode transistors 513 and 515 are disabled.

In an exemplary design, cascode transistors 513 and 515 may be controlled by an analog voltage whereas shunt transistor 517 may be controlled by a digital control signal. Cascode transistors 513 and 515 may be enabled by applying an appropriate bias voltage. The bias voltage of transistors 513 and 515 determines the drain-to-source voltage across gain transistor 514 and may be selected to keep gain transistor 514 in saturation. Cascode transistors 513 and 515 may be disabled by applying a low voltage (e.g., 0 Volts (V)). Shunt transistor 517 may be enabled by applying logic high (e.g., VDD) or disabled by applying logic low (e.g., 0V) at its gate.

In the exemplary design shown in FIG. 5, cascode circuit 516 has a T-switch like structure and includes two cascode transistors 513 and 515 coupled to shunt transistor 517. Cascode transistors 513 and 515 may be designed such that they can provide comparable performance to that of cascode transistor 416 in FIG. 4. In an exemplary design, cascode transistors 416, 513 and 515 may have similar width, and cascode transistors 513 and 515 may have a combined length that is approximately equal to the length of cascode transistor 416, as follows:

$$L=L_1+L_2,\qquad\text{Eq (1)}$$

where L is the length of cascode transistor 416,
$L_1$ is the length of cascode transistor 513, and
$L_2$ is the length of cascode transistor 515.

In an exemplary design, cascode transistors 513 and 515 may each have a length of approximately one half the length of cascode transistor 416, or $L_1=L_2=L/2$. In another exemplary design, cascode transistor 513 may have a length of approximately three quarter the length of cascode transistor 416, or $L_1=3L/4$ and $L_2=L/4$. In yet another exemplary design, cascode transistor 513 may have a length of $L_1=L/n$, and cascode transistor 515 may have a length of $L_2=(n-1)*L/n$, where n may be an integer or non-integer value. The lengths of cascode transistors 513 and 515 may also be some other percentage of the length of cascode transistor 416. Maintaining the combined length of cascode transistors 513 and 515 approximately equal to the length of cascode transistor 416 may ensure that two series-coupled cascode transistors 513 and 515 can provide similar performance as single cascode transistor 416, assuming that the transistors have similar width.

In general, a cascode circuit may include (i) a through path between its input and output and (ii) a shunt path between a node in the through path and circuit ground. The through path may be implemented with one or more transistors coupled between the input and output of the cascode circuit. The shunt path may be implemented with one or more transistors coupled between the node in the through path and circuit ground. The cascode circuit may be enabled by enabling the through path (e.g., turning ON the transistor(s) in the through path) and disabling the shunt path (e.g., turning OFF the transistor(s) in the shunt path). Conversely, the cascode circuit may be disabled by disabling the through path (e.g., turning OFF the transistor(s) in the through path) and enabling the shunt path (e.g., turning ON the transistor(s) in the shunt path).

FIG. 5 shows an exemplary design of an LNA with improved isolation via the use of a cascode circuit. An LNA with improved isolation may also be implemented in other manners. In another exemplary design, an LNA may include a feedback circuit coupled between an output and an input of the LNA. The feedback circuit may comprise a resistor, a capacitor, a transistor, some other circuit component, or a combination thereof. The feedback circuit may help with input matching and may also improve linearity of the LNA.

Figure 6:
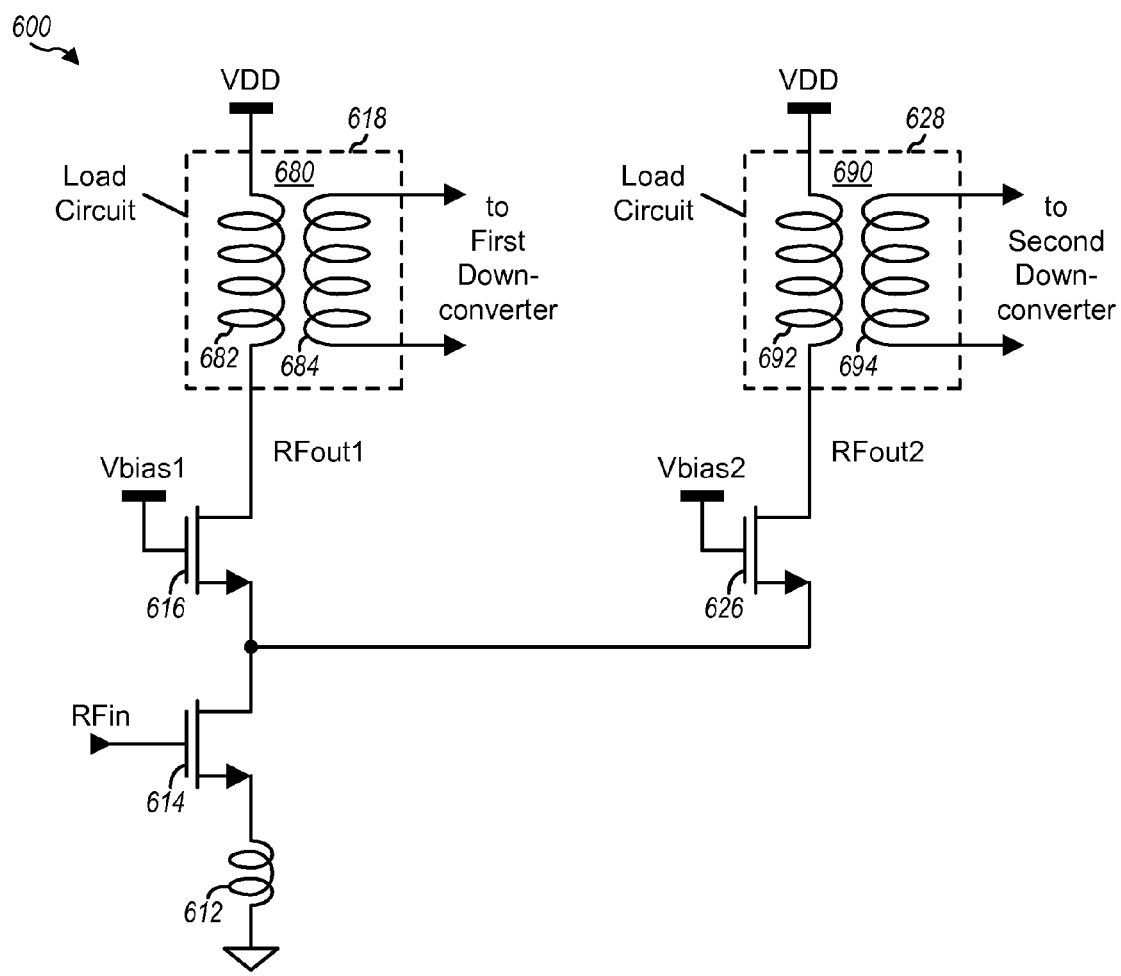
FIG. 6 shows an exemplary design of a single-input multiple-output (SIMO) LNA.

FIG. 6 shows a schematic diagram of an exemplary design of a SIMO LNA 600 with inductive degeneration and cascode shutoff. In the exemplary design shown in FIG. 6, LNA 600 includes a source degeneration inductor 612, a gain transistor 614, and two cascode transistors 616 and 626. Gain transistor 614 has its gate receiving an input RF signal and its source coupled to one end of inductor 612. The other end of inductor 612 is coupled to circuit ground. Cascode transistor 616 has its source coupled to the drain of gain transistor 614, its gate receiving a first bias voltage (Vbias1), and its drain coupled to a load circuit 618. Cascode transistor 626 has its source coupled to the drain of gain transistor 614, its gate receiving a second bias voltage (Vbias2), and its drain coupled to a load circuit 628. Gain transistor 614 and cascode transistors 616 and 626 may be implemented with NMOS transistors, as shown in FIG. 6, or with transistors of other types.

In the exemplary design shown in FIG. 6, load circuit 618 includes a transformer 680 comprising a primary coil 682 and a secondary coil 684. Primary coil 682 is coupled between the drain of cascode transistor 616 and a power supply (VDD). Secondary coil 684 provides a first differential output RF signal to a first downconverter (not shown in FIG. 6). Load circuit 628 includes a transformer 690 having (i) a primary coil 692 coupled between the drain of cascode transistor 626 and the VDD supply and (ii) a secondary coil 694 providing a second differential output RF signal to a second downconverter (not shown in FIG. 6).

SIMO LNA 600 may operate in a single-output mode or a multi-output mode at any given moment. In the single-output mode, SIMO LNA 600 receives an input RF signal comprising at least one transmitted signal (e.g., on one set of carriers) and provides one output RF signal for one downconverter. One cascode transistor 616 or 626 is enabled to provide the output RF signal, and the other cascode transistor is disabled. In the multi-output mode, SIMO LNA 600 receives an input RF signal comprising at least two transmitted signals (e.g., on two sets of carriers) and provides two output RF signals for two downconverters (e.g., one output RF signal for each set of carriers). Both cascode transistor 616 or 626 are enabled to provide the two output RF signals.

In the exemplary design shown in FIG. 6, cascode transistors 616 and 626 are used for buffering and also as cascode shut-off switches. For example, in the single-output mode, cascode transistor 616 may be enabled to provide an output RF signal for a first downconverter, and cascode transistor 626 may be disabled to provide isolation between load circuit 628 and gain transistor 614. An LO signal for a second downconverter may leak through the second downconverter and may be coupled from secondary coil 694 to primary coil 692. Ideally, cascode transistor 626 should be completely turned OFF and should block the leaked LO signal from coupling to gain transistor 614. However, in a practical implementation, cascode transistor 626 has limited isolation, and a portion of the leaked LO signal is coupled through cascode transistor 626 and presented to gain transistor 614. The leaked LO signal is passed through cascode transistor 616 and may degrade the performance of the transmitted signal(s) being received via cascode transistor 616 and load circuit 618.

Figure 7A:
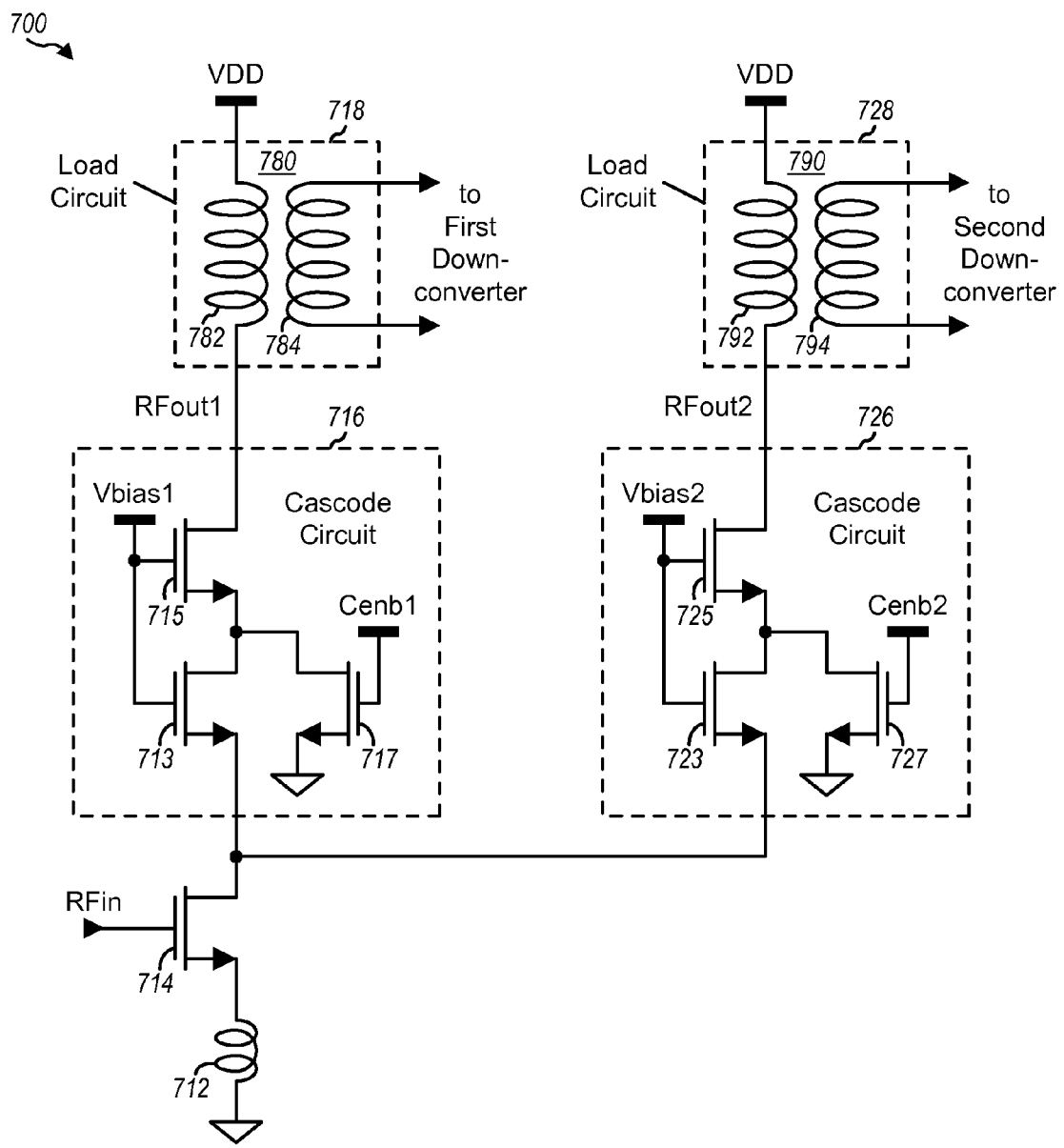
FIGS. 7A to 7C show three exemplary designs of a SIMO LNA with improved isolation.

FIG. 7A shows a schematic diagram of an exemplary design of a SIMO LNA 700 with improved isolation. LNA 700 may be used for any of LNAs 330 and 332 in FIG. 3. In the exemplary design shown in FIG. 7A, LNA 700 includes a source degeneration inductor 712, a gain transistor 714, and two cascode circuits 716 and 726. Gain transistor 714 has its gate receiving an input RF signal, its source coupled to one end of inductor 712, and its drain coupled to cascode circuits 716 and 726. The other end of inductor 712 is coupled to circuit ground. Gain transistor 714 may also have its source coupled directly to circuit ground (instead of to a source degeneration inductor). Cascode circuit 716 is further coupled to a load circuit 718 and provides a first output RF signal (RFout1). Cascode circuit 726 is further coupled to a load circuit 728 and provides a second output RF signal (RFout2).

In the exemplary design shown in FIG. 7A, cascode circuit 716 includes (i) two cascode transistors 713 and 715 coupled in a stack and (ii) a shunt transistor 717 coupled between cascode transistors 713 and 715 and circuit ground. Cascode transistors 713 and 715 and shunt transistor 717 are coupled in similar manner as cascode transistors 513 and 515 and shunt transistor 517 in FIG. 5. Cascode transistors 713 and 715 receive a first bias voltage (Vbias1) at their gates, and shunt transistor 717 receives a first control signal (Cenb1) at its gate. Cascode circuit 726 includes (i) two cascode transistors 723 and 725 coupled in a stack and (ii) a shunt transistor 727 coupled between cascode transistors 723 and 725 and circuit ground. Cascode transistors 723 and 725 and shunt transistor 727 are coupled in similar manner as cascode transistors 513 and 515 and shunt transistor 517 in FIG. 5. Cascode transistors 723 and 725 receive a second bias voltage (Vbias2) at their gates, and shunt transistor 727 receives a second control signal (Cenb2) at its gate.

Cascode transistors 713 and 715 may be implemented with suitable lengths, as described above, to obtain performance similar to the performance of cascode transistor 616 in FIG. 6. Similarly, cascode transistors 723 and 725 may be implemented with suitable lengths to obtain similar performance as cascode transistor 626 in FIG. 6. In one exemplary design, the cascode transistors may have similar width, and the lengths of cascode transistors 713 and 715 match the lengths of cascode transistors 723 and 725, respectively, e.g., to obtain similar performance for cascode circuits 716 and 726. In another exemplary design, the lengths of cascode transistors 713 and 715 may be different from the lengths of cascode transistors 723 and 725, respectively, e.g., to obtain different performance characteristics for cascode circuits 716 and 726.

SIMO LNA 700 may also be implemented in other manners. In another exemplary design, a SIMO LNA may include a gain transistor having its source coupled directly to circuit ground (instead of to a source degeneration inductor). In yet another exemplary design, a SIMO LNA may include two gain transistors coupled in parallel and having their gates receiving the input RF signal. A first gain transistor may have its source coupled to a source degeneration inductor, as shown in FIG. 7A. A second gain transistor may have its source coupled directly to circuit ground. Either the first or second gain transistor may be selected.

In the exemplary design shown in FIG. 7A, load circuit 718 includes a transformer 780 comprising a primary coil 782 and a secondary coil 784. Primary coil 782 is coupled between cascode circuit 716 and the VDD supply. Secondary coil 784 provides a first differential output RF signal to a first downconverter (not shown in FIG. 7A). Load circuit 728 includes a transformer 790 having (i) a primary coil 792 coupled between cascode circuit 726 and the VDD supply and (ii) a secondary coil 794 providing a second differential output RF signal to a second downconverter (not shown in FIG. 7A).

Load circuits 718 and 728 may also be implemented in other manners. In another exemplary design, a load circuit may include an inductor and possibly a capacitor coupled between the VDD supply and the drain of a cascode transistor. Cascode transistors 715 and 725 may provide output RF signals at their drains. In yet another exemplary design, a load circuit may include a P-channel metal oxide semiconductor (PMOS) transistor having its source coupled to the VDD supply and its drain coupled to the drain of a cascode transistor (e.g., cascode transistor 715 or 725). The PMOS transistor may provide an active load for the cascode transistor.

For simplicity, FIG. 7A shows SIMO LNA 700 including two cascode circuits 716 and 726 to provide up to two output RF signals to up to two load circuits 718 and 728, e.g., for up to two sets of carriers being received simultaneously for carrier aggregation. In general, a SIMO LNA may include N cascode circuits coupled to N load circuits to provide up to N output RF signals, where N may be any integer value greater than one.

SIMO LNA 700 may operate in a single-output mode or a multi-output mode at any given moment. In the single-output mode, SIMO LNA 700 receives an input RF signal comprising at least one transmitted signal (e.g., on one set of carriers) and provides one output RF signal via one cascode circuit 716 or 726 to one downconverter circuit. In the multi-output mode, SIMO LNA 700 receives an input RF signal comprising at least two transmitted signals (e.g., on two sets of carriers) and provides two output RF signals via two cascode circuits 716 and 726 to two downconverter circuits (e.g., one output RF signal for each set of carriers).

Cascode circuit 716 may be enabled in the single-output mode or the multi-output mode to provide the RFout1 signal to load circuit 718. This may be achieved by (i) turning ON cascode transistors 713 and 715 by applying an appropriate bias voltage to the gates of transistors 713 and 715 and (ii) turning OFF shunt transistor 717 by applying logic low to the gate of transistor 717. Conversely, cascode circuit 716 may be disabled by (i) turning OFF cascode transistors 713 and 715 by applying a low voltage to the gates of transistors 713 and 715 and (ii) turning ON shunt transistor 717 by applying logic high to the gate of transistor 717. Cascode circuit 726 may be enabled in the single-output mode or the multi-output mode to provide the RFout2 signal to load circuit 728. This may be achieved by (i) turning ON cascode transistors 723 and 725 by applying an appropriate bias voltage to the gates of transistors 723 and 725 and (ii) turning OFF shunt transistor 727 by applying logic low to the gate of transistor 727. Conversely, cascode circuit 726 may be disabled by (i) turning OFF cascode transistors 723 and 725 by applying a low voltage to the gates of transistors 723 and 725 and (ii) turning ON shunt transistor 727 by applying logic high to the gate of transistor 727.

Figure 7B:
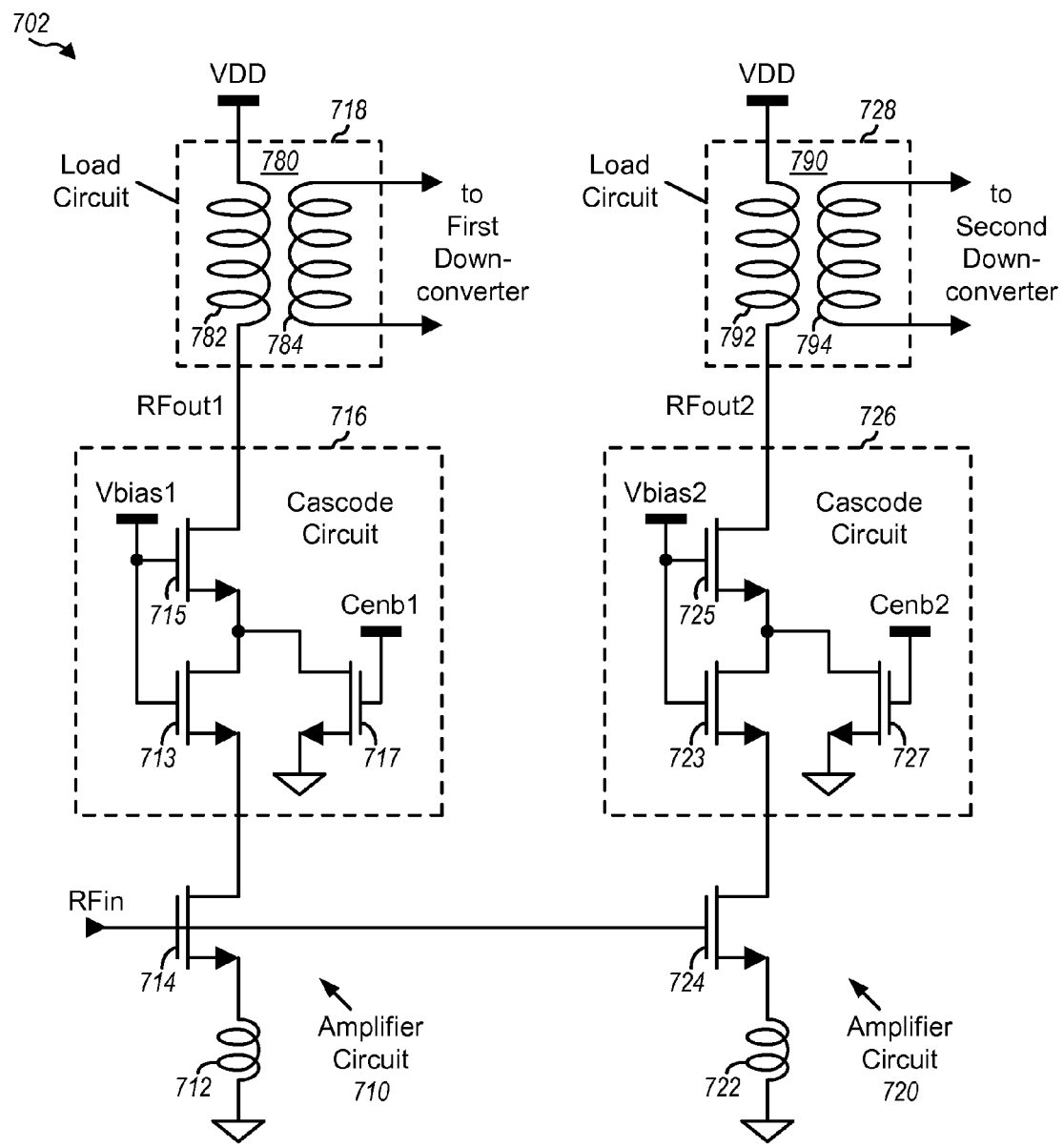

FIG. 7B shows a schematic diagram of an exemplary design of a SIMO LNA 702 with improved isolation. LNA 702 may also be used for any of LNAs 330 and 332 in FIG. 3. In the exemplary design shown in FIG. 7B, LNA 702 includes all of the circuit components within LNA 700 in FIG. 7A. LNA 702 further includes a second gain transistor 724 and a second source degeneration inductor 722. Gain transistor 724 has its gate receiving the input RF signal, its source coupled to one end of inductor 722, and its drain coupled to cascode circuit 726. The other end of inductor 722 is coupled to circuit ground. Gain transistor 714 has its drain coupled to only cascode circuit 716 (instead of both cascode circuits 716 and 726 as shown in FIG. 7A).

In the exemplary design shown in FIG. 7B, LNA 702 comprises (i) a first amplifier circuit 710 formed by gain transistor 714, cascode circuit 716, and inductor 712 and (ii) a second amplifier circuit 720 formed by gain transistor 724, cascode circuit 726, and inductor 722.

In the exemplary design shown in FIG. 7B, separate source degeneration inductors 712 and 722 are used for amplifier circuits 710 and 720 in order to reduce interaction between the two amplifier circuits and help reduce noise figure (NF) degradation. Source degeneration inductors 712 and 722 may also improve linearity of amplifier circuits 710 and 720 and help input matching of SIMO LNA 702. Inductors 712 and 722 may have the same value or different values. The values of inductors 712 and 722 may be selected (e.g., independently) to obtain good performance for amplifier circuits 710 and 720. In another exemplary design, one amplifier circuit 710 or 720 may include a source degeneration inductor, and the other amplifier circuit may omit the source degeneration inductor and have its gain transistor coupled to circuit ground. In yet another exemplary design, both amplifier circuits 710 and 720 may omit source degeneration inductors and have their gain transistors coupled to circuit ground.

SIMO LNA 702 may operate in a single-output mode or a multi-output mode at any given moment. In the single-output mode, either amplifier circuit 710 or 720 is enabled to provide an output RF signal to the associated load circuit 718 or 728. In the multi-output mode, both amplifier circuits 710 and 720 are enabled to provide two output RF signals to load circuits 718 and 728, respectively.

In the single-output mode, both gain transistors 714 and 724 are enabled by the input RF signal that is applied to these transistors. Since the cascode circuit in the disabled amplifier circuit (e.g., cascode circuit 726) is disabled, the gain transistor (e.g., gain transistor 724) in the disabled amplifier circuit operates in a linear region. Hence, a gain transistor in an amplifier circuit may operate in (i) the saturation region when the amplifier circuit is enabled or (ii) the linear region when the amplifier circuit is disabled. Operating the gain transistor of the disabled amplifier circuit in the linear region may help to reduce variations of the input impedance of SIMO LNA 702 between the single-output mode and the multi-output mode.

In the exemplary design shown in FIG. 7B, the input RF signal is split at the "gate" level by having the input RF signal applied to two gain transistors 714 and 724 driving two cascode circuits 716 and 726. In contrast, in the exemplary design shown in FIG. 7A, the input RF signal is split at the "cascode" level by having the input RF signal applied to a single gain transistor driving two cascode circuits 716 and 726. Splitting the input RF signal at the gate level (as shown in FIG. 7B) may provide better performance than splitting the input RF signal at the cascode level (as shown in FIG. 7A). The better performance with gate-level splitting may include better gain, lower noise figure, improved linearity, better isolation to reduce coupling of leaked LO signals for downconverters, etc.

In another exemplary design, cascode transistors may be used in place of cascode circuits 716 and 726. A shunt transistor may be coupled between the drain of gain transistor 714 and circuit ground. The shunt transistor may be turned ON to short the drain of gain transistor 714 when transistor 714 is not turned ON, which may improve isolation. Alternatively or additionally, a shunt transistor may be coupled between the drain of gain transistor 724 and circuit ground and may be turned ON to short the drain of gain transistor 724.

Figure 7C:
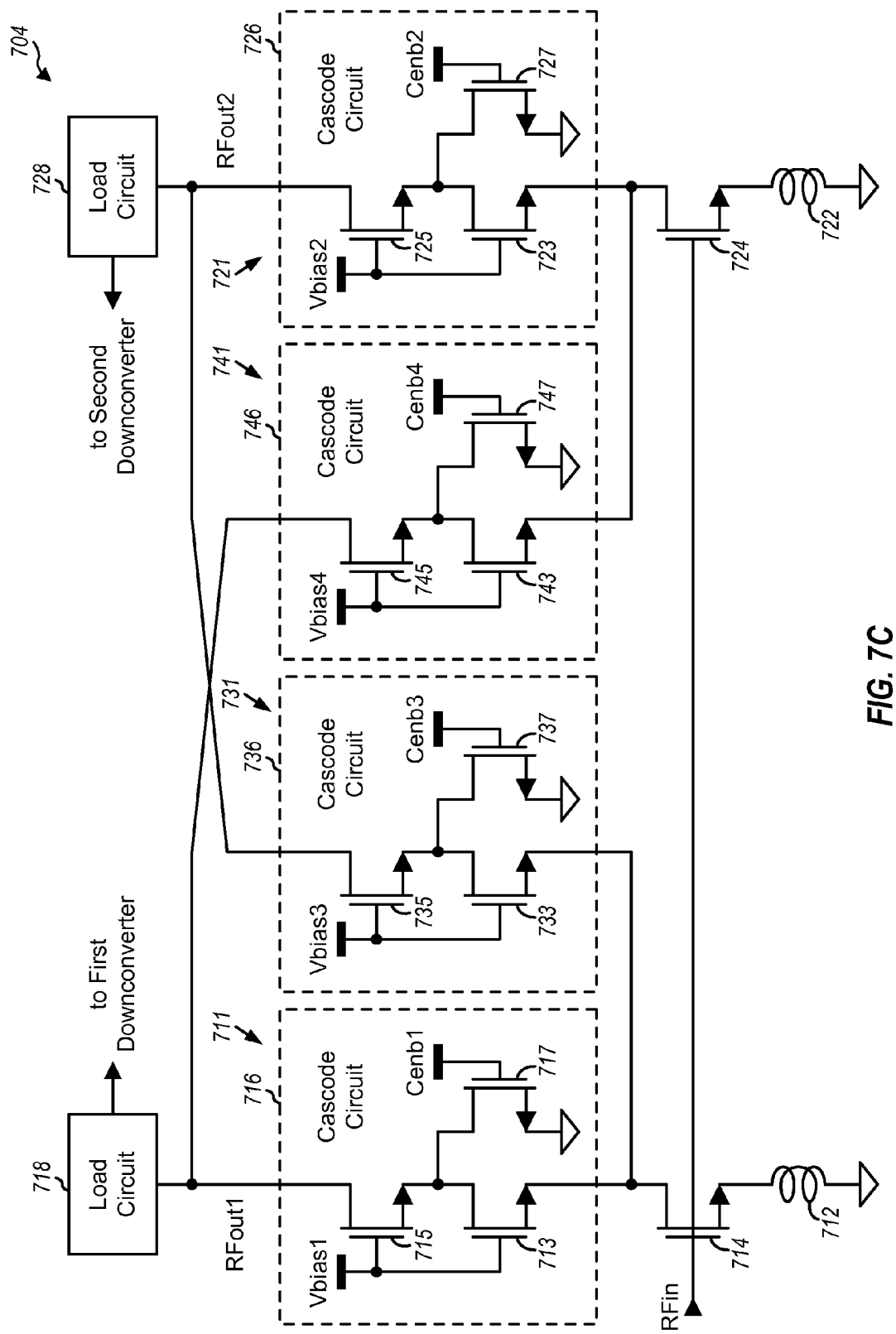

FIG. 7C shows a schematic diagram of an exemplary design of a SIMO LNA 704 with cascode divert switch and improved isolation. LNA 704 may also be used for any of LNAs 330 and 332 in FIG. 3. In the exemplary design shown in FIG. 7C, LNA 704 includes all of the circuit components in LNA 702 in FIG. 7B. LNA 704 further includes (i) a third cascode circuit 736 coupled between the drain of gain transistor 714 and load circuit 728 and (ii) a fourth cascode circuit 746 coupled between the drain of gain transistor 724 and load circuit 718.

Cascode circuit 736 includes (i) two cascode transistors 733 and 735 coupled in a stack and (ii) a shunt transistor 737 coupled between cascode transistors 733 and 735 and circuit ground. Cascode transistors 733 and 735 and shunt transistor 737 are coupled in similar manner as cascode transistors 513 and 515 and shunt transistor 517 in FIG. 5. Cascode transistors 733 and 735 receive a third bias voltage (Vbias3) at their gates, and shunt transistor 737 receives a third control signal (Cenb3) at its gate. Cascode circuit 746 includes (i) two cascode transistors 743 and 745 coupled in a stack and (ii) a shunt transistor 747 coupled between cascode transistors 743 and 745 and circuit ground. Cascode transistors 743 and 745 and shunt transistor 747 are coupled in similar manner as cascode transistors 513 and 515 and shunt transistor 517 in FIG. 5. Cascode transistors 743 and 745 receive a fourth bias voltage (Vbias4) at their gates, and shunt transistor 747 receives a fourth control signal (Cenb4) at its gate.

SIMO LNA 704 may operate in a single-output mode or a multi-output mode at any given moment. In the single-output mode, both gain transistors 714 and 724 are enabled, and two cascode circuits are enabled. Cascode circuits 716 and 746 may be enabled to generate a first output RF signal (RFout1) for load circuit 718, and cascode circuits 726 and 736 may be disabled. Gain transistors 714 and 724 amplify the input RF signal and provide amplified signals, which are buffered by the enabled cascode circuits 716 and 746 and combined to generate the RFout1 signal for load circuit 718. Alternatively, cascode circuits 726 and 736 may be enabled to generate a second output RF signal (RFout2) for load circuit 728, and cascode circuits 716 and 746 may be disabled. Gain transistors 714 and 724 amplify the input RF signal and provide amplified signals, which are buffered by the enabled cascode circuits 726 and 736 and combined to generate the RFout2 signal for load circuit 728.

In the multi-output mode, both gain transistors 714 and 724 are enabled, and cascode circuits 716 and 726 are enabled. Gain transistors 714 and 724 amplify the input RF signal and provide two amplified signals, which are buffered by cascode circuits 716 and 726 to obtain two output RF signals for two load circuits 718 and 728. Alternatively, both gain transistors 714 and 724 are enabled, and all cascode circuits 716, 726, 736 and 746 are enabled. Gain transistors 714 and 724 amplify the input RF signal and provide two amplified signals. The amplified signal from gain transistor 714 is split between cascode circuits 716 and 736, and the amplified signal from gain transistor 724 is split between cascode circuits 726 and 746. The signals from cascode circuits 716 and 746 are combined to obtain the RFout1 signal for load circuit 718. The signals from cascode circuits 726 and 736 are combined to obtain the RFout2 signal for load circuit 728. Each cascode circuit may be enabled or disabled as described above for FIGS. 7A and 7B.

SIMO LNA 704 includes two main paths and two divert paths. A first main path 711 is formed by gain transistor 714 and cascode circuit 716, and a second main path 721 is formed by gain transistor 724 and cascode circuit 726. A first divert path 731 is formed by gain transistor 714 and cascode circuit 736, and a second divert path 741 is formed by gain transistor 724 and cascode circuit 746. In the single-output mode, one main path and one divert path are enabled, and the signals from both enabled paths are combined to generate the output RF signal. In particular, the first main path 711 and the second divert path 741 may be enabled to generate the RFout1 signal. Alternatively, the second main path 721 and the first divert path 731 may be enabled to generate the RFout2 signal. In the multi-output mode, both main paths 711 and 721 are enabled to generate the RFout1 and RFout2 signals.

In the single-output mode, one main path 711 or 721 is enabled to provide one output RF signal. In addition, both gain transistors 714 and 724 are enabled in order to reduce variations of the input impedance of LNA 704. Furthermore, one divert path 731 or 741 is also enabled and steers the RF current from the gain transistor in the disabled main path into the enabled main path. This RF current switching boosts the gain/transconductance of LNA 704 in the single-output mode.

FIGS. 7A to 7C show three exemplary designs of SIMO LNAs with improved isolation through the use of cascode circuits. A SIMO LNA with improved isolation may also be implemented in other manners. In another exemplary design, a SIMO LNA may include a single divert cascode circuit 736 or 746 (instead of both divert cascode circuits 736 and 746 shown in FIG. 7C). In yet another exemplary design, a SIMO LNA may include one or more gain transistors each having its source coupled to circuit ground (instead of to a source degeneration inductor). A degeneration inductor may also be shared between multiple gain transistors in order to save circuit area. In yet another exemplary design, a SIMO LNA may include a feedback circuit coupled between an input and an output of the LNA. The feedback circuit may comprise a resistor, a capacitor, a transistor, some other circuit component, or a combination thereof. The feedback circuit may help with input matching and may also improve linearity of the SIMO LNA.

Figure 8A:
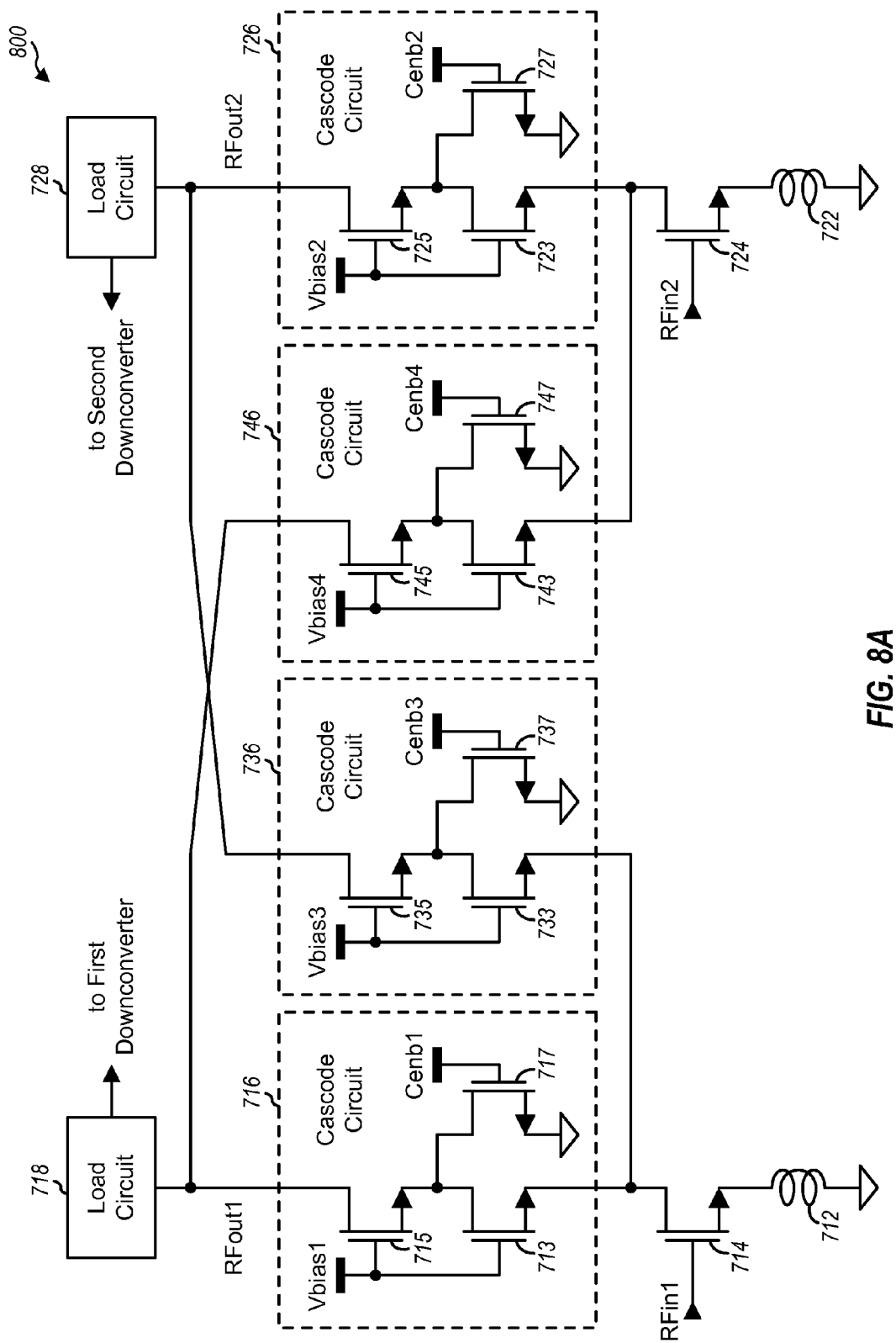
FIGS. 8A and 8B show two exemplary designs of a multiple-input multiple-output (MIMO) LNA with improved isolation.

FIG. 8A shows a schematic diagram of an exemplary design of a MIMO LNA 800 with improved isolation. LNA 800 may be used for any of LNAs 330 and 332 in FIG. 3. In the exemplary design shown in FIG. 8A, LNA 800 includes all of the circuit components in LNA 704 in FIG. 7C. However, gain transistors 714 and 724 are not coupled together as in LNA 704. Rather, gain transistor 714 has its gate receiving a first input RF signal (RFin1), which may be provided by a first input matching circuit for a first band (not shown in FIG. 8A). Gain transistor 724 has its gate receiving a second input RF signal (RFin2), which may be provided by a second input matching circuit for the first band or a second band (not shown in FIG. 8A). LNA 800 may thus support intra-band CA as well as inter-band CA.

Figure 8B:
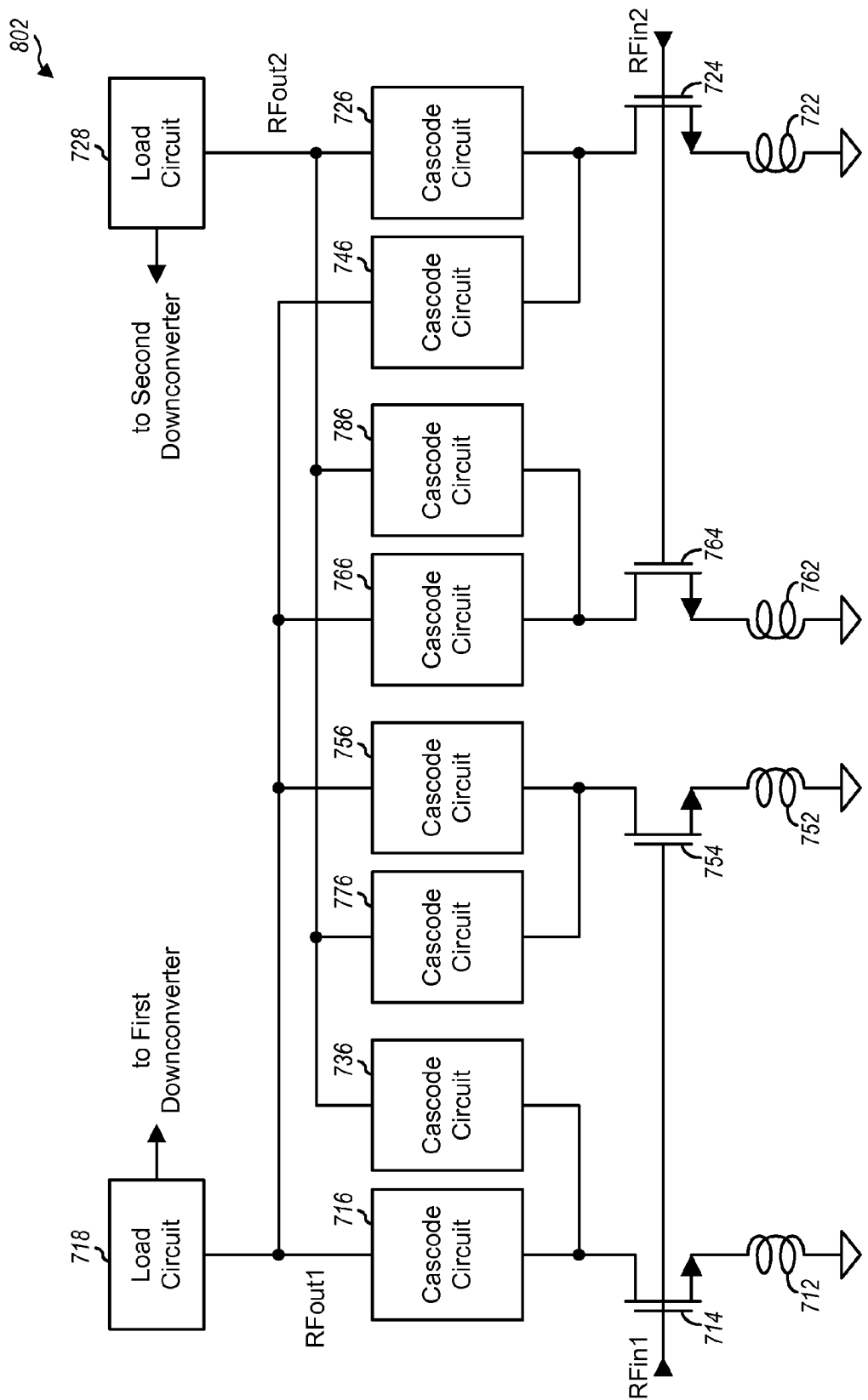

FIG. 8B shows a schematic diagram of an exemplary design of a MIMO LNA 802 with improved isolation. LNA 802 may be used for any of LNAs 330 and 332 in FIG. 3. In the exemplary design shown in FIG. 8B, LNA 802 includes all of the circuit components in LNA 800 in FIG. 8A. LNA 802 further includes (i) a gain transistor 754, an inductor 752, and cascode circuits 756 and 776 for the RFin1 signal and (ii) a gain transistor 764, an inductor 762, and cascode circuits 766 and 786 for the RFin2 signal. Gain transistor 754 has its gate receiving the RFin1 signal and its source coupled to one end of inductor 752. The other end of inductor 752 is coupled to circuit ground. Cascode circuit 756 is coupled between the drain of gain transistor 754 and load circuit 718. Cascode circuit 776 is coupled between the drain of gain transistor 754 and load circuit 728. Gain transistor 764 has its gate receiving the RFin2 signal and its source coupled to one end of inductor 762. The other end of inductor 762 is coupled to circuit ground. Cascode circuit 766 is coupled between the drain of gain transistor 764 and load circuit 718. Cascode circuit 786 is coupled between the drain of gain transistor 764 and load circuit 728. Cascode circuits 716, 726, 736, 746, 756, 766, 776 and 786 may each be implemented with two cascode transistors and a shunt transistor, e.g., as shown in FIG. 8A.

LNA 802 may also be considered as comprising two copies of LNA 704 in FIG. 7C. The first copy of LNA 704 receives the RFin1 signal and, when enabled, provides one or two RFout signals to one or two load circuits. The second copy of LNA 704 receives the RFin2 signal and, when enabled, provides one or two RFout signals to one or two load circuits.

FIGS. 8A and 8B show two exemplary designs of MIMO LNAs with improved isolation via the use of cascode circuits. A MIMO LNA with improved isolation may also be implemented in other manners. In another exemplary design, a MIMO LNA may include one or more gain transistors each having its source coupled to circuit ground (instead of to a source degeneration inductor). In yet another exemplary design, a MIMO LNA may include a feedback circuit coupled between an input and an output of the MIMO LNA.

Bias voltages for cascode transistors within cascode circuits may be generated in various manners. In one exemplary design, a bias voltage may be generated independently for the cascode transistors in each cascode circuit. In another exemplary design, a bias voltage may be generated for the cascode transistors in multiple cascode circuits.

Figure 9:
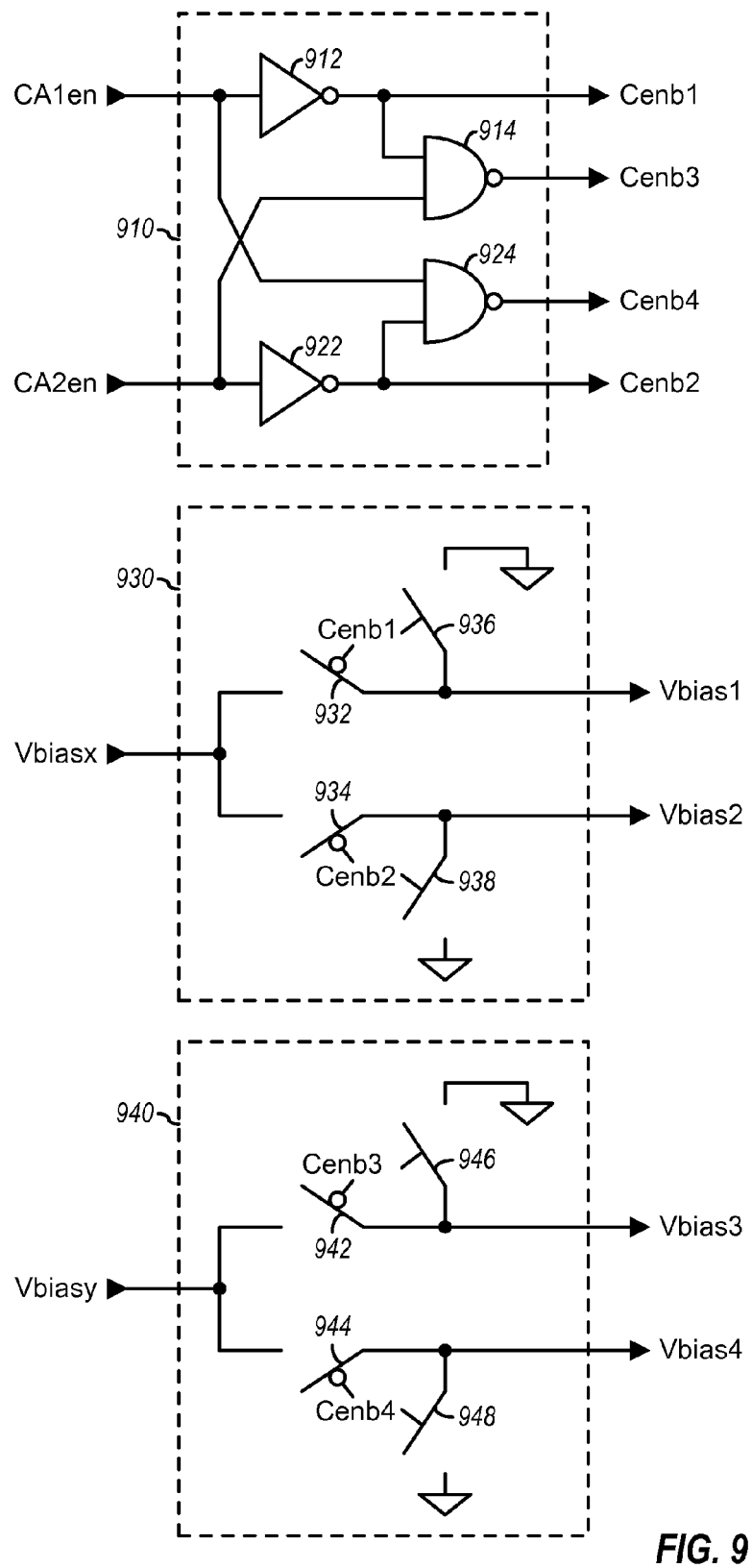
FIG. 9 shows circuits to generate bias voltages and control signals.

FIG. 9 shows a schematic diagram of an exemplary design of circuits to generate bias voltages and control signals for SIMO LNA 704 in FIG. 7C. A control circuit 910 receives CA1en and CA2en control signals and generates Cenb1, Cenb2, Cenb3 and Cenb4 control signals for shunt transistors 717, 727, 737 and 747, respectively, in FIG. 7C. The CA1en signal is at logic high to generate the RFout1 signal for a first set of carriers being received. The CA2en signal is at logic high to generate the RFout2 signal for a second set of carriers being received. Each Cenbx signal (for x=1, 2, 3 or 4) is at logic low to disable a corresponding shunt transistor or at logic high to enable the shunt transistor. Within control circuit 910, an inverter 912 receives the CA1en signal and provides the Cenb1 signal. An inverter 922 receives the CA2en signal and provides the Cenb2 signal. A NAND gate 914 receives the CA2en signal at a first input and the Cenb1 signal at a second input and provides the Cenb3 signal. A NAND gate 924 receives the Cenb2 signal at a first input and the CA1en signal at a second input and provides the Cenb4 signal.

A bias generator 930 receives a Vbiasx voltage at its input and generates Vbias1 and Vbias2 voltages at its first and second outputs, respectively. The Vbias1 and Vbias2 voltages are provided to the gates of cascode transistors in cascode circuits 716 and 726, respectively, in FIG. 7C. Within bias generator 930, a switch 932 is coupled between an input and a first output of bias generator 930. A switch 934 is coupled between the input and a second output of bias generator 930. A switch 936 is coupled between the first output of bias generator 930 and circuit ground. A switch 938 is coupled between the second output of bias generator 930 and circuit ground. Switches 932 and 934 are closed by logic low and are opened by logic high on the Cenb1 and Cenb2 signals, respectively. Switches 936 and 938 are closed by logic high and are opened by logic low on the Cenb1 and Cenb2 signals, respectively.

A bias generator 940 receives a Vbiasy voltage at its input and generates Vbias3 and Vbias4 voltages at its first and second outputs, respectively. The Vbias3 and Vbias4 voltages are provided to the gates of cascode transistors in cascode circuits 736 and 746, respectively, in FIG. 7C. Within bias generator 940, a switch 942 is coupled between an input and a first output of bias generator 940. A switch 944 is coupled between the input and a second output of bias generator 940. A switch 946 is coupled between the first output of bias generator 940 and circuit ground. A switch 948 is coupled between the second output of bias generator 940 and circuit ground. Switches 942 and 944 are closed by logic low and are opened by logic high on the Cenb3 and Cenb4 signals, respectively. Switches 946 and 948 are closed by logic high and are opened by logic low on the Cenb3 and Cenb4 signals, respectively.

FIG. 9 shows an exemplary design of circuits to generate bias voltages and control signals for cascode transistors and shunt transistors within a cascode circuit in a SIMO LNA. Bias voltages and control signals may also be generated in other manners. In an exemplary design, the same bias voltage may be provided to both bias generators 930 and 940. In another exemplary design, different bias voltages may be provided to bias generators 930 and 940.

The use of cascode circuits, each comprising series cascode transistors and a shunt transistor, in amplifiers may improve performance. In particular, isolation between multiple outputs of an amplifier may be improved with the use of cascode circuits. This may be desirable in a carrier aggregation receiver. For example, in inter-band CA for some band combinations, strong out-of-band jammers on one carrier in a first band may leak through an off signal path of a first LNA to an output of a second LNA for a second band and may fall in-band, which may cause significant desensitization and/or may raise linearity requirement of the receiver.

Figure 10:
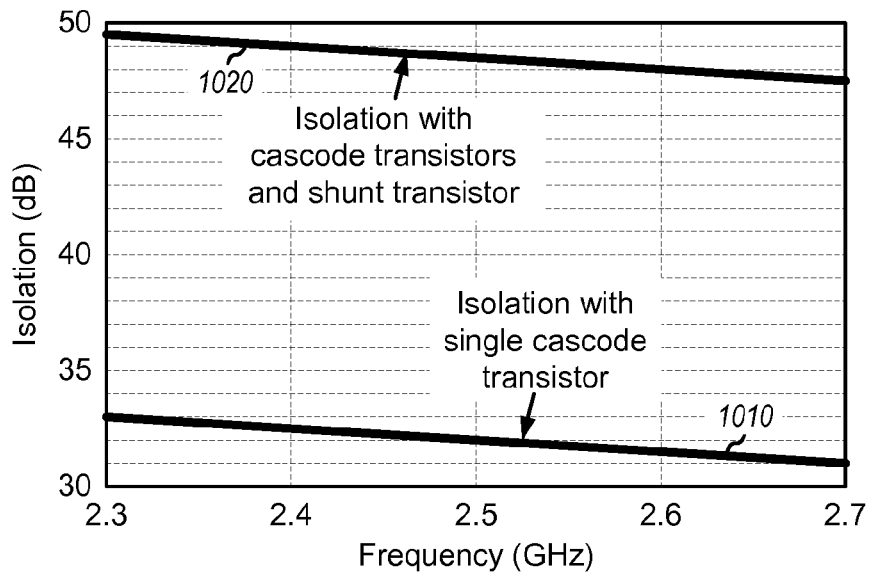
FIG. 10 shows plots of isolation for LNAs with and without improved isolation.

FIG. 10 shows plots of isolation for LNAs with and without the cascode circuits. In FIG. 10, the horizontal axis represents frequency and is given in units of gigahertz (GHz). The vertical axis represents isolation between two outputs of an LNA (e.g., a SIMO LNA or a MIMO LNA) and is given in units of decibels (dB). A plot 1010 shows isolation between two outputs of an LNA with conventional cascode transistors, e.g., LNA 600 in FIG. 6. An isolation of approximately 32 dB is obtained from an output that is turned OFF to an output that is turned ON. A plot 1020 shows isolation between two outputs of an LNA with cascode circuits, e.g., LNA 700 in FIG. 7A. An isolation of approximately 47 dB is obtained from an output that is turned OFF to an output that is turned ON. FIG. 10 shows that isolation may be improved by approximately 15 dB with the cascode circuits, in accordance with one exemplary design.

Amplifiers with cascode circuits described herein may provide various advantages. First, isolation may be improved with the use of shunt transistors in the cascode circuits, e.g., as shown in FIG. 10. Second, performance of the cascode circuits may be comparable to performance of conventional cascode transistors. This may be achieved by selecting appropriate lengths for cascode transistors within the cascode circuits, as described above. Third, the cascode circuits may be implemented with little additional circuit/die area and may minimally increase cost. Fourth, current consumption of the amplifiers may not be impacted or increased due to the use of the cascode circuits. The amplifiers with cascode circuits may thus be able to achieve better isolation with minimal cost in terms of performance, circuit area, and power consumption.

In an exemplary design, an apparatus (e.g., a wireless device, an IC, a circuit module, etc.) may include a gain transistor, first and second cascode transistors, and a shunt transistor. The gain transistor (e.g., gain transistor 514 in FIG.

5 or gain transistor 714 in FIGS. 7A to 8A) may receive an input signal and provide an amplified signal. The first cascode transistor (e.g., cascode transistor 513 in FIG. 5 or cascode transistor 713 in FIGS. 7A to 8A) may be coupled between the gain transistor and an intermediate node and may receive the amplified signal. The second cascode transistor (e.g., cascode transistor 515 in FIG. 5 or cascode transistor 715 in FIGS. 7A to 8A) may be coupled between the intermediate node and an output node and may provide an output signal. The shunt transistor (e.g., shunt transistor 517 in FIG. 5 or shunt transistor 717 in FIGS. 7A to 8A) may be coupled between the intermediate node and circuit ground.

The gain transistor may have its source coupled to an inductor, which may be further coupled to circuit ground. Alternatively, the gain transistor may have its source coupled directly to circuit ground.

The first and second cascode transistors may be enabled to provide the output signal in a first mode and may be disabled in a second mode. The shunt transistor may be disabled in the first mode and enabled in the second mode in order to short the intermediate node to circuit ground when the first and second cascode transistors are disabled. The first and second cascode transistors may have gates coupled together and may receive a bias voltage that enables or disables these cascode transistors. The shunt transistor may receive a control signal that enables or disables the shunt transistor.

The first and second cascode transistors and the shunt transistor may form a first cascode circuit, e.g., cascode circuit 716 in FIGS. 7B and 8A. The cascode transistors may provide an output signal when these cascode transistors are enabled. The shunt transistor may short the intermediate node to circuit ground when the shunt transistor is enabled. The cascode transistors may have lengths selected based on at least one target operating characteristic of the cascode circuit. For example, the first cascode transistor may have a first length, and the second transistor may have a second length. The first and second lengths may be selected based on at least one target operating characteristic of the first cascode circuit. The first length may match the second length or may be different from the second length.

In an exemplary design, the apparatus may further include a second cascode circuit, e.g., for a SIMO LNA with cascode-level splitting in FIG. 7A. The second cascode circuit (e.g., cascode circuit 726 in FIG. 7A) may be coupled between the gain transistor and a second output node and may provide a second output signal when the second cascode circuit is enabled. The second cascode circuit may include third and fourth cascode transistors and a second shunt transistor. The third cascode transistor (e.g., cascode transistor 723) may be coupled between the gain transistor and a second intermediate node. The fourth cascode transistor (e.g., cascode transistor 725) may be coupled between the second intermediate node and a second output node and may provide a second output signal when the third and fourth cascode transistors are enabled. The second shunt transistor (e.g., shunt transistor 727) may be coupled between the second intermediate node and circuit ground and may short the second intermediate node to circuit ground when the second shunt transistor is enabled.

In another exemplary design, the apparatus may further include a second gain transistor and a second cascode circuit, e.g., for a SIMO LNA with gate-level splitting in FIGS. 7B and 7C. The second gain transistor (e.g., gain transistor 724 in FIGS. 7B and 7C) may receive the input signal and provide a second amplified signal. The second cascode circuit (e.g., cascode circuit 726 in FIGS. 7B and 7C) may be coupled between the second gain transistor and a second output node and may provide a second output signal when the second cascode circuit is enabled. In an exemplary design, the apparatus may further include third and fourth cascode circuits. The third cascode circuit (e.g., cascode circuit 736 in FIG. 7C) may be coupled between the gain transistor and the second output node and may provide the second output signal when the second and third cascode circuits are enabled. The fourth cascode circuit (e.g., cascode circuit 746 in FIG. 7C) may be coupled between the second gain transistor and the output node and may provide the output signal when the first and fourth cascode circuits are enabled.

In yet another exemplary design, the apparatus may further include a second gain transistor and second, third, and fourth cascode circuits, e.g., for a MIMO LNA in FIGS. 8A and 8B. The second gain transistor (e.g., gain transistors 724 in FIGS. 8A and 8B) may receive a second input signal and provide a second amplified signal. The second cascode circuit (e.g., cascode circuit 726 in FIGS. 8A and 8B) may be coupled between the second gain transistor and a second output node and may provide a second output signal. The third cascode circuit (e.g., cascode circuit 736 in FIGS. 8A and 8B) may be coupled between the gain transistor and the second output node. The fourth cascode circuit (e.g., cascode circuit 746 in FIGS. 8A and 8B) may be coupled between the second gain transistor and the output node.

The apparatus may further include third and fourth gain transistors and fifth to eighth cascode circuits, e.g., for the MIMO LNA in FIG. 8B. The third gain transistor (e.g., gain transistor 754) may receive the input signal and provide a third amplified signal. The fifth cascode circuit (e.g., cascode circuit 756) may be coupled between the third gain transistor and the output node. The sixth cascode circuit (e.g., cascode circuit 776) may be coupled between the third gain transistor and the second output node. The fourth gain transistor (e.g., gain transistor 764) may receive the second input signal and provide a fourth amplified signal. The seventh cascode circuit (e.g., cascode circuit 766) may be coupled between the fourth gain transistor and the output node. The eighth cascode circuit (e.g., cascode circuit 786) may be coupled between the fourth gain transistor and the second output node.

Figure 11:
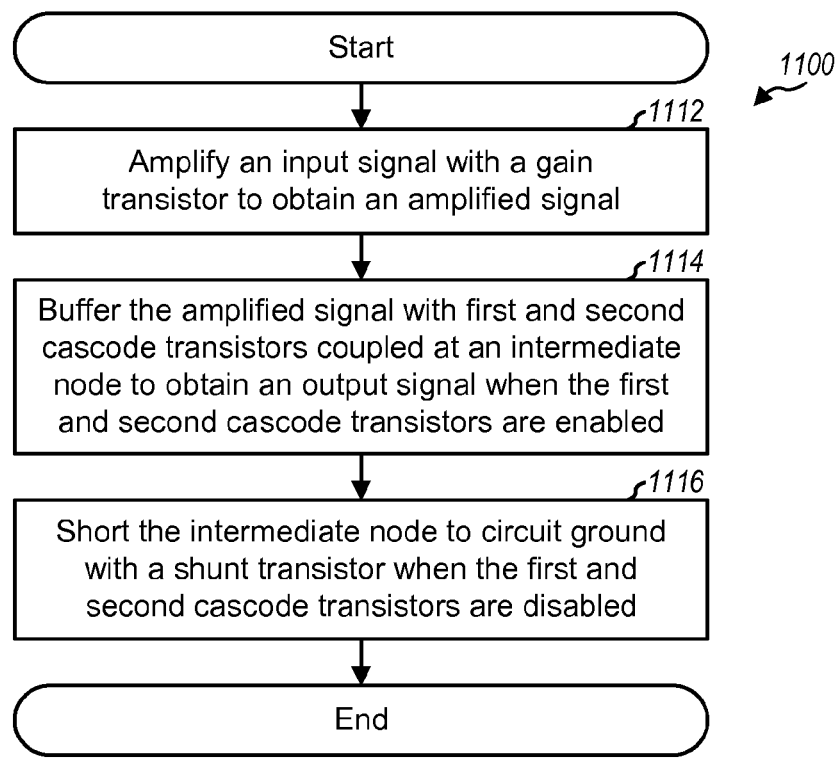
FIG. 11 shows a process for performing amplification.

FIG. 11 shows an exemplary design of a process 1100 for performing amplification. An input signal may be amplified with a gain transistor (e.g., gain transistor 514 in FIG. 5 or gain transistor 714 in FIGS. 7A to 8B) to obtain an amplified signal (block 1112). The amplified signal may be buffered with first and second cascode transistors (e.g., cascode transistors 513 and 515 in FIG. 5 or cascode transistors 713 and 715 in FIGS. 7A to 8B) coupled at an intermediate node to obtain an output signal when the first and second cascode transistors are enabled (block 1114). For example, the first cascode transistor may be coupled between the gain transistor and an intermediate node, and the second cascode transistor may be coupled between the intermediate node and an output node. The intermediate node may be shorted to circuit ground with a shunt transistor (e.g., shunt transistor 517 in FIG. 5 or shunt transistor 717 in FIGS. 7A to 8B) when the first and second cascode transistors are disabled (block 1116).

In an exemplary design (e.g., for a SIMO LNA with cascode-level splitting shown in FIG. 7A), the amplified signal may be buffered with third and fourth cascode transistors (e.g., cascode transistors 723 and 725) coupled at a second intermediate node to obtain a second output signal when the third and fourth cascode transistors are enabled. The second intermediate node may be shorted to circuit ground with a second shunt transistor (e.g., shunt transistor 727) when the third and fourth cascode transistors are disabled.

In another exemplary design (e.g., for a SIMO LNA with gate-level splitting shown in FIG. 7B), the input signal may be amplified with a second gain transistor (e.g., gain transistor 724) to obtain a second amplified signal. The second amplified signal may be buffered with third and fourth cascode transistors (e.g., cascode transistors 723 and 725) coupled at a second intermediate node to obtain a second output signal when the third and fourth cascode transistors are enabled. The second intermediate node may be shorted to circuit ground with a second shunt transistor (e.g., shunt transistor 727) when the third and fourth cascode transistors are disabled.

In yet another exemplary design (e.g., for a MIMO LNA shown in FIGS. 8A and 8B), a second input signal may be amplified with a second gain transistor (e.g., gain transistor 724) to obtain a second amplified signal. The second amplified signal may be buffered with third and fourth cascode transistors (e.g., cascode transistors 723 and 725) coupled at a second intermediate node to obtain a second output signal when the third and fourth cascode transistors are enabled. The second intermediate node may be shorted to circuit ground with a second shunt transistor (e.g., shunt transistor 727) when the third and fourth cascode transistors are disabled. The first amplified signal may be buffered with fifth and sixth cascode transistors (e.g., cascode transistors 733 and 735) coupled at a third intermediate node to obtain the second output signal when the fifth and sixth cascode transistors are enabled. The third intermediate node may be shorted to circuit ground with a third shunt transistor (e.g., shunt transistor 737) when the fifth and sixth cascode transistors are disabled. The second amplified signal may be buffered with seventh and eighth cascode transistors (e.g., cascode transistors 743 and 745) coupled at a fourth intermediate node to obtain the output signal when the seventh and eighth cascode transistors are enabled. The fourth intermediate node may be shorted to circuit ground with a fourth shunt transistor (e.g., shunt transistor 747) when the seventh and eighth cascode transistors are disabled. Additional gain transistors, cascode transistors, and/or shunt transistors may also be used for amplification, buffering, and shorting.

The amplifiers with improved isolation described herein may be implemented on an IC, an analog IC, an RFIC, a mixed-signal IC, an ASIC, a printed circuit board (PCB), an electronic device, etc. The amplifiers with improved isolation may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the amplifiers with improved isolation described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
 a gain transistor configured to receive an input signal and to provide an amplified signal;
 a first cascode transistor coupled between the gain transistor and an intermediate node, the first cascode transistor having a first gate and configured to be enabled based on a bias voltage received at the first gate;
 a second cascode transistor coupled between the intermediate node and an output node, the second cascode transistor having a second gate that is coupled to the first gate, the second cascode transistor configured to be enabled based on receiving the bias voltage at the second gate and configured to provide an output signal; and
 a shunt transistor coupled between the intermediate node and ground.

2. The apparatus of claim 1, further comprising:
 a third cascode transistor coupled between the gain transistor and a second intermediate node;
 a fourth cascode transistor coupled between the second intermediate node and a second output node, the fourth cascode transistor configured to provide a second output signal; and
 a second shunt transistor coupled between the second intermediate node and ground.

3. The apparatus of claim 1, wherein the first cascode transistor, the second cascode transistor, and the shunt transistor comprise a first cascode circuit, the apparatus further comprising:
 a second gain transistor configured to receive the input signal and to provide a second amplified signal; and
 a second cascode circuit coupled between the second gain transistor and a second output node, the second cascode circuit configured to provide a second output signal.

4. The apparatus of claim 3, further comprising:
a third cascode circuit coupled between the gain transistor and the second output node, a fourth cascode circuit coupled between the second gain transistor and the output node, or a combination thereof.

5. The apparatus of claim 1, wherein the first cascode transistor, the second cascode transistor, and the shunt transistor comprise a first cascode circuit, the apparatus further comprising:
a second gain transistor configured to receive a second input signal and to provide a second amplified signal; and
a second cascode circuit coupled between the second gain transistor and a second output node, the second cascode circuit configured to provide a second output signal.

6. The apparatus of claim 5 further comprising:
a third cascode circuit coupled between the gain transistor and the second output node; and
a fourth cascode circuit coupled between the second gain transistor and the output node.

7. The apparatus of claim 6, further comprising:
a third gain transistor configured to receive the input signal and to provide a third amplified signal;
a fifth cascode circuit coupled between the third gain transistor and the output node; and
a sixth cascode circuit coupled between the third gain transistor and the second output node.

8. The apparatus of claim 7, further comprising:
a fourth gain transistor configured to receive the second input signal and to provide a fourth amplified signal;
a seventh cascode circuit coupled between the fourth gain transistor and the output node; and
an eighth cascode circuit coupled between the fourth gain transistor and the second output node.

9. The apparatus of claim 1, wherein the first cascode transistor has a first length and the second cascode transistor has a second length, and wherein the first length and the second length are selected based on at least one target operating characteristic of the first cascode transistor and the second cascode transistor.

10. The apparatus of claim 9, wherein the first length and the second length are the same length.

11. The apparatus of claim 1, further comprising a cascode circuit coupled between the gain transistor and a second output node, the cascode circuit configured to provide a second output signal.

12. The apparatus of claim 11, wherein the cascade circuit comprises:
a third cascade transistor coupled between the gain transistor and a second intermediate node; and
a second shunt transistor coupled between the second intermediate node and ground.

13. A method comprising:
amplifying an input signal via a gain transistor to provide an amplified signal;
buffering the amplified signal based on a first operating mode via a first cascode transistor coupled to an intermediate node and a second cascode transistor coupled to the intermediate node to provide an output signal, wherein, during the first operating mode, the first cascode transistor is enabled, a shunt transistor is disabled, and the second cascode transistor is enabled and provides the output signal; and
shorting the intermediate node to ground via the shunt transistor based on a second operating mode.

14. The method of claim 13, further comprising:
buffering the amplified signal via a third cascode transistor and a fourth cascode transistor to provide a second output signal when the third cascode transistor and the fourth cascode transistor are enabled, the third cascode transistor and the fourth cascode transistor coupled to a second intermediate node; and
shorting the second intermediate node to ground via a second shunt transistor when the third cascode transistor and the fourth cascode transistor are disabled.

15. The method of claim 13, further comprising:
amplifying the input signal via a second gain transistor to provide a second amplified signal;
buffering the second amplified signal via a third cascode transistor and a fourth cascode transistor to provide a second output signal when the third cascode transistor and the fourth cascode transistor are enabled, the third cascode transistor and the fourth cascode transistor coupled to a second intermediate node; and
shorting the second intermediate node to ground via a second shunt transistor when the third cascode transistor and the fourth cascode transistor are disabled.

16. The method of claim 13, further comprising:
amplifying a second input signal via a second gain transistor to provide a second amplified signal;
buffering the second amplified signal with third cascode transistor and a fourth cascode transistor to provide a second output signal when the third cascode transistor and the fourth cascode transistor are enabled, the third cascode transistor and the fourth cascode transistor coupled to a second intermediate node; and
shorting the second intermediate node to ground via a second shunt transistor when the third cascode transistor and the fourth cascode transistor are disabled.

17. The method of claim 13, wherein, during the second operating mode, the first cascode transistor and the second cascode transistor are disabled and the shunt transistor is enabled.

18. An apparatus comprising:
means for providing an amplified signal based on an input signal;
first means for buffering the amplified signal, the first means for buffering coupled between the means for providing the amplified signal and an intermediate node the first means for buffering configured to be enabled based on a bias voltage received at a first gate;
second means for buffering the amplified signal, the second means for buffering coupled between the intermediate node and an output node and configured to be enabled based on the bias voltage received at a second gate that is coupled to the first gate; and
means for shorting the intermediate node to ground.

19. The apparatus of claim 18, further comprising:
third means for buffering the amplified signal, the third means for buffering coupled between the means for providing the amplified signal and a second intermediate node;
fourth means for buffering the amplified signal, the fourth means for buffering coupled between the second intermediate node and a second output node, the fourth means for buffering configured to provide a second output signal; and
means for shorting the second intermediate node to ground.

20. The apparatus of claim 18, further comprising:
second means for providing a second amplified signal based on a second input signal;
third means for buffering the second amplified signed, the third means for buffering coupled between the second means for providing the second amplified signal and a second intermediate node;
fourth means for buffering the second amplified signal, the fourth means for buffering coupled between the second intermediate node and a second output node, the fourth means for buffering configured to provide a second output signal; and
means for shorting the second intermediate node to ground.

* * * * *